United States Patent
Chang et al.

(10) Patent No.: US 8,604,471 B2
(45) Date of Patent: Dec. 10, 2013

(54) SEMICONDUCTOR STRUCTURE AND ORGANIC ELECTROLUMINESCENCE DEVICE

(75) Inventors: Chih-Pang Chang, Taipei (TW); Hsing-Hung Hsieh, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 168 days.

(21) Appl. No.: 13/208,360

(22) Filed: Aug. 12, 2011

(65) Prior Publication Data

US 2012/0298983 A1 Nov. 29, 2012

(30) Foreign Application Priority Data

May 24, 2011 (TW) .............................. 100118144 A

(51) Int. Cl.
*H01L 29/786* (2006.01)
(52) U.S. Cl.
USPC .......... 257/43; 257/59; 257/72; 257/E29.296; 349/43; 349/44
(58) Field of Classification Search
None
See application file for complete search history.

(56) References Cited

U.S. PATENT DOCUMENTS

| | | | |
|---|---|---|---|
| 5,838,399 A | 11/1998 | Someya et al. | |
| 2006/0046339 A1* | 3/2006 | Seo et al. | 438/57 |
| 2007/0051943 A1 | 3/2007 | Lee et al. | |
| 2007/0176554 A1* | 8/2007 | Kwak | 313/512 |
| 2007/0290227 A1 | 12/2007 | Liang et al. | |
| 2007/0296333 A1 | 12/2007 | Kim et al. | |
| 2008/0217618 A1 | 9/2008 | Deane | |
| 2008/0278435 A1* | 11/2008 | Song et al. | 345/107 |
| 2010/0244022 A1 | 9/2010 | Takahashi et al. | |
| 2010/0295042 A1 | 11/2010 | Yano et al. | |
| 2011/0198607 A1* | 8/2011 | Mori et al. | 257/72 |
| 2011/0215337 A1* | 9/2011 | Egami | 257/72 |

FOREIGN PATENT DOCUMENTS

| | | |
|---|---|---|
| CN | 1743930 | 3/2006 |
| JP | 2010199459 | 9/2010 |

OTHER PUBLICATIONS

"First Office Action of China Counterpart Application", issued on Aug. 14, 2012, p. 1-p. 9, in which the listed references were cited.

* cited by examiner

*Primary Examiner* — Minh-Loan T Tran
*Assistant Examiner* — Fazli Erdem
(74) *Attorney, Agent, or Firm* — Jinaq Chyun IP Office

(57) ABSTRACT

A semiconductor structure and an organic electroluminescence device applying the same are provided. A gate insulating layer covers a gate electrode disposed on a substrate. A channel layer has a channel length L along a channel direction and has a first side and a second side opposite to the first side. The channel layer is located on the gate insulating layer over the gate electrode. A source electrode and a drain electrode are located at and electrically connected to the first side and the second side of the channel layer, respectively. A conductive light-shielding pattern layer is disposed on a dielectric layer covering the source electrode, the drain electrode and the channel layer, and is overlapped to a portion of the source electrode and a portion of the channel layer in a vertical projection. The conductive light-shielding pattern layer and the channel layer have an overlapping length d1, and $0.3 \leq d1/L \leq 0.85$.

18 Claims, 5 Drawing Sheets ic structure and an organic electroluminescence device will be described.

SEMICONDUCTOR STRUCTURE AND ORGANIC ELECTROLUMINESCENCE DEVICE

CROSS-REFERENCE TO RELATED APPLICATION

This application claims the priority benefit of Taiwan application serial no. 100118144, filed on May 24, 2011. The entirety of the above-mentioned patent application is hereby incorporated by reference herein and made a part of this specification.

BACKGROUND OF THE INVENTION

1. Field of the Invention

The invention relates to a semiconductor structure. Particularly, the invention relates to a semiconductor structure adapted to a light emitting device.

2. Description of Related Art

A channel layer of a thin film transistor is made of oxide semiconductor (which is referred to as an oxide semiconductor thin film transistor), which can effectively improve carrier mobility of the device. Meanwhile, since the oxide semiconductor is transparent, conductive, amorphous and suitable for low temperature process, etc., the oxide semiconductor thin film transistor is adapted to be applied to display panels.

However, when the oxide semiconductor thin film transistor is applied to an active matrix liquid crystal display (AM-LCD) or an active matrix organic light emitting display (AMOLED), ultraviolet (UV)-light irradiation is required during a packaging process or a UV-bleach process. Therefore, since the channel layer of the oxide semiconductor thin film transistor is irradiated by UV-light, a device characteristic thereof is probably unstable, for example, a drain induced barrier lowering (DIBL) effect is probably occurred to cause a current leakage phenomenon of the device, which may influence a display quality.

SUMMARY OF THE INVENTION

The invention is directed to a semiconductor structure, which is capable of effectively preventing a device characteristic variation occurred when a device is irradiated by light.

The invention is directed to an organic electroluminescence device, which uses the semiconductor structure of the invention to provide good and stable device characteristics.

The invention provides a semiconductor structure, which disposed on a substrate. The semiconductor structure includes a gate electrode, a gate insulating layer, a channel layer, a source electrode, a drain electrode, a dielectric layer and a conductive light-shielding pattern layer. The gate electrode and the gate insulating layer are disposed on the substrate, and the gate insulating layer covers the gate electrode. The channel layer is disposed on the gate insulating layer and located above the gate electrode. The channel layer has a channel length L along a channel direction and has a first side and a second side opposite to the first side. The source electrode and the drain electrode are located at the two opposite sides of the channel layer, and are electrically connected to the first side and the second side of the channel layer, respectively. The dielectric layer covers the source electrode, the drain electrode and the channel layer. The conductive light-shielding pattern layer is disposed on the dielectric layer, and is overlapped to a portion of the source electrode and a portion of the channel layer in a vertical projection, where the conductive light-shielding pattern layer and the channel layer have an overlapping length d1, and $0.3 \leq d1/L \leq 0.85$.

In an embodiment of the invention, a material of the channel layer includes oxide semiconductor.

In an embodiment of the invention, the oxide semiconductor includes indium gallium zinc oxide (IGZO).

In an embodiment of the invention, the conductive light-shielding pattern layer has a third side and a fourth side along the channel direction. The fourth side is overlapped to the channel layer, where the overlapping length is equal to a distance between the fourth side and the first side of the channel layer along the channel direction.

In an embodiment of the invention, the channel layer covers a portion of the source electrode and a portion of the drain electrode.

In an embodiment of the invention, the source electrode and the drain electrode respectively cover a portion of the channel layer.

In an embodiment of the invention, the semiconductor structure further includes an etching stop layer disposed on the channel layer, and the source electrode and the drain electrode respectively cover a portion of the etching stop layer.

In an embodiment of the invention, the drain electrode has a fifth side along the channel direction, where the fifth side is overlapped to the channel layer, and the fifth side and the second side are spaced by a distance t1 along the channel direction, and $0 < t1/L < 0.15$.

The invention provides an organic electroluminescence device including the aforementioned semiconductor structure, an organic light emitting layer disposed on the conductive light-shielding pattern layer of the semiconductor structure, and an upper electrode disposed on the organic light emitting layer.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In order to mitigate influence on a thin film transistor caused by light irradiation, for example, a drain induced barrier lowering (DIBL) effect and a current leakage phenomenon, a light mask is used to define a light-shielding layer covering the device, so as to shield the light from directly irradiating the channel layer. However, if the light-shielding layer covers a drain electrode of the device, an extra electric field is generated during operation of the device, which may cause shift and decrease of a threshold voltage of the device driven by a high source voltage, and may also cause the current leakage phenomenon.

Therefore, a covering area of the light-shielding layer is further adjusted to balance a light-shielding effect and device performance.

Figure 1A:
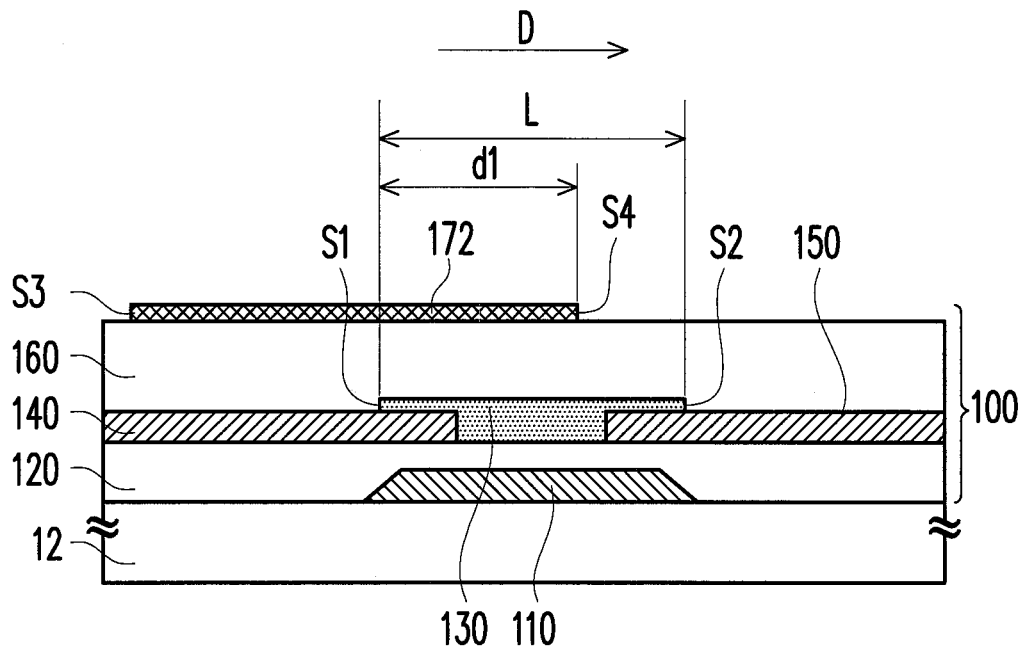
FIG. 1A is a cross-sectional view of a semiconductor structure according to an embodiment of the invention.
Figure 1B:
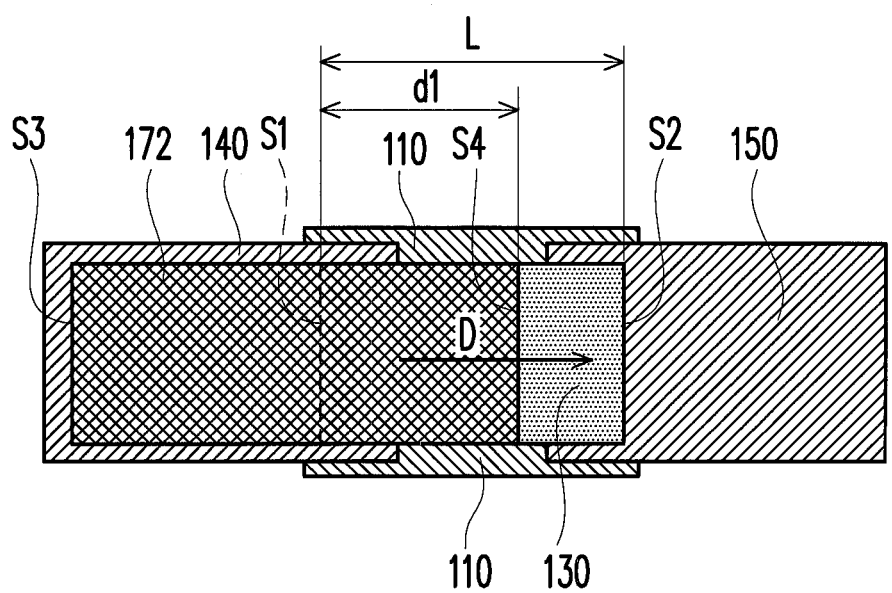
FIG. 1B is a top view of the semiconductor structure of FIG. 1A.

FIG. 1A is a cross-sectional view of a semiconductor structure according to an embodiment of the invention, and FIG. 1B is a top view of the semiconductor structure of FIG. 1A. For clarity's sake, only a part of the components of the semiconductor structure of FIG. 1A is illustrated in FIG. 1B. As shown in FIG. 1A and FIG. 1B, a gate electrode 110 of the semiconductor structure 100 is disposed on a substrate 12. A gate insulating layer 120 is disposed on the substrate 12 and covers the gate electrode 110. A channel layer 130 is disposed on the gate insulating layer 120 and located above the gate electrode 110. In the present embodiment, a material of the channel layer 130 is, for example, an oxide semiconductor material, such as indium gallium zinc oxide (IGZO), indium gallium oxide (IGO), indium zinc oxide (IZO), etc., which is preferably the IGZO semiconductor. The channel layer 130 has a channel length L along a channel direction D, and has a first side S1 and a second side S2 opposite to the first side S1.

A source electrode 140 and a drain electrode 150 of the semiconductor structure 100 are located at the two opposite sides of the channel layer 130, and the source electrode 140 and the drain electrode 150 are electrically connected to the first side S1 and the second side S2 of the channel layer 130. In the present embodiment, the channel layer 130 covers a portion of the source electrode 140 and a portion of the drain electrode 150. In other words, the first side S1 and the second side S2 of the channel layer 130 are respectively located on the source electrode 140 and the drain electrode 150. Moreover, a dielectric layer 160 covers the source electrode 140, the drain electrode 150 and the channel layer 130. The semiconductor structure of the present embodiment is an oxide semiconductor thin film transistor structure.

A conductive light-shielding pattern layer 172 is disposed on the dielectric layer 160. The conductive light-shielding pattern layer 172 is electrically floating, which is not electrically connected to other electrodes, and is overlapped to a portion of the source electrode 140 and a portion of the channel layer 130 in a vertical projection. The conductive light-shielding pattern layer 172 can be formed by a metal layer, or can be formed by a stacked layer of a metal layer and a transparent conductive layer. Moreover, the conductive light-shielding pattern layer 172 and the channel layer 130 have an overlapping length d1 along the channel direction D. In the present embodiment, the conductive light-shielding pattern layer 172 may have any shape that has a light-shielding effect. For example, the conductive light-shielding pattern layer 172 is a rectangle, and has a third side S3 and a fourth side S3 along the channel direction D, where the fourth side S4 is overlapped to the channel layer 130 in the vertical projection. Here, the overlapping length d1 is equal to a distance between the fourth side S4 and the first side S1 of the channel layer 130 along the channel direction D.

Considering both of the light-shielding effect, the device performance and the DIBL effect, the overlapping length d1 of the present embodiment is $0.3 \leq d1/L \leq 0.85$, which is preferably $0.4 \leq d1/L \leq 0.7$. In detail, the conductive light-shielding pattern layer 172 is overlapped to a portion of the channel layer 130 in the vertical projection, and the overlapping length thereof is more than 0.3 L, which can mitigate the DIBL effect, and shield a certain amount of the light (for example, an ultraviolet (UV) light) in the light irradiation step to reduce the influence on the channel layer 130 caused by the light irradiation. On the other hand, the overlapping length between the conductive light-shielding pattern layer 172 and the channel layer 130 is limited under 0.85 L, so that the conductive light-shielding pattern layer 172 is not over closed to the drain electrode 150 or even cover the drain electrode 150, so as to avoid generating the extra electric field during operation of the device, and prevent occurrence of the current leakage.

Figure 2:
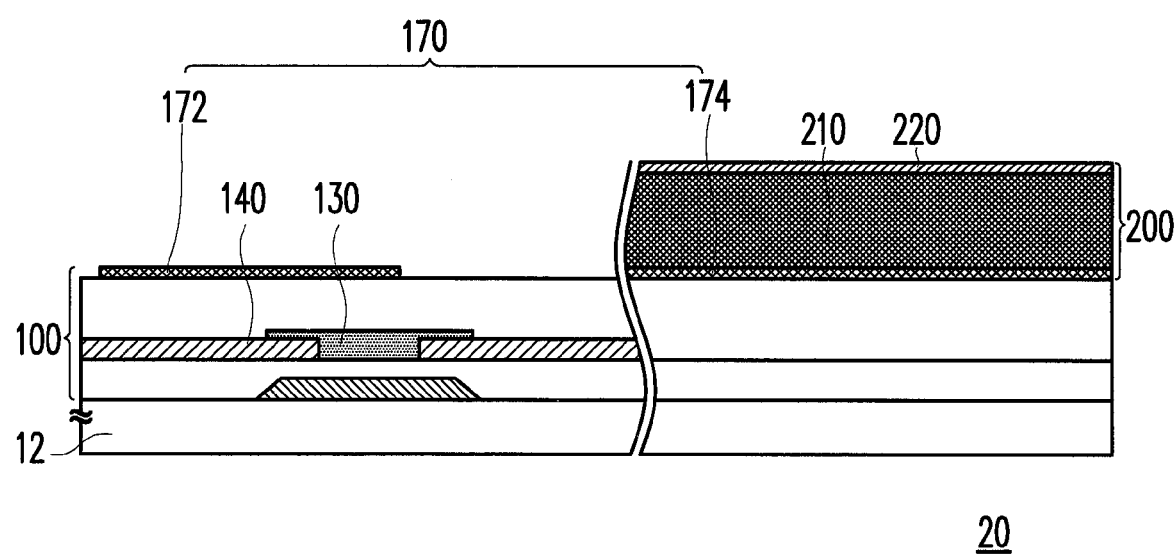
FIG. 2 is a cross-sectional view of an organic electroluminescence device applying the semiconductor structure of FIG. 1A and FIG. 1B.

The semiconductor structure of the invention is adapted to be applied to an organic electroluminescence device. Referring to FIG. 2, FIG. 2 is a cross-sectional view of an organic electroluminescence device 20 applying the semiconductor structure 100 of FIG. 1A and FIG. 1B. The organic electroluminescence device 20 includes the aforementioned semiconductor structure 100 disposed on the substrate 12 and an organic light emitting diode (OLED) 200. In an embodiment, the semiconductor structure 100 can serve as a switching transistor, which is electrically connected to the OLED 200 through other circuits (not shown), as that shown in FIG. 2. In another embodiment, the semiconductor structure 100 can also serve as a driving transistor, and the OLED 200 can be electrically connected to the drain electrode 150 of the semiconductor structure 100 through a contact window, and the above techniques are well known by those skilled in the art, so that details thereof are not repeated. When a lower electrode 174 of the OLED 200 is fabricated, a conductive light-shielding pattern layer 172 can be simultaneously fabricated. In the present embodiment, when a pattern of the conductive layer 170 is fabricated, besides the conductive light-shielding pattern layer 172 used for shielding a portion of the source electrode 140 and a portion of the channel layer 130 is formed, the lower electrode 174 can be simultaneously formed. In other words, the conductive light-shielding pattern layer 172 and the lower electrode 174 can be obtained by patterning a same material layer. An organic light emitting layer 210 is disposed on the lower electrode 174 of the conductive layer 170. An upper electrode 220 is disposed on the organic light emitting layer 210. The lower electrode 174 can be electrically connected to the drain electrode 150 directly or indirectly. In this way, a voltage can be applied through the upper electrode 220 and the lower electrode 174 to drive the organic light emitting layer 210 to emit light.

In an embodiment, the conductive layer 170 can be a metal layer or a stacked layer of the metal layer and a transparent conductive layer, and the conductive layer 170 is patterned to form the conductive light-shielding pattern layer 172 and the lower electrode 174, and then the organic light emitting layer 210 and the upper electrode 220 are fabricated, where the upper electrode 220 is a transparent conductive layer, and now the organic electroluminescence device 20 emitting light upwards is formed. In another embodiment, the conductive layer 170 can be a stacked layer of the metal layer and the transparent conductive layer. The conductive layer 170 is patterned to form the conductive light-shielding pattern layer 172 and the lower electrode 174, and the metal layer on the lower electrode 174 is removed to left the lower transparent conductive layer, and then the organic light emitting layer 210 and the upper electrode 220 are fabricated, where the upper electrode 220 is an opaque conductive layer, and now the organic electroluminescence device 20 emitting light downwards is formed.

The thin film transistor structure of the aforementioned embodiment may have other variations according to actual application requirements.

Figure 3A:
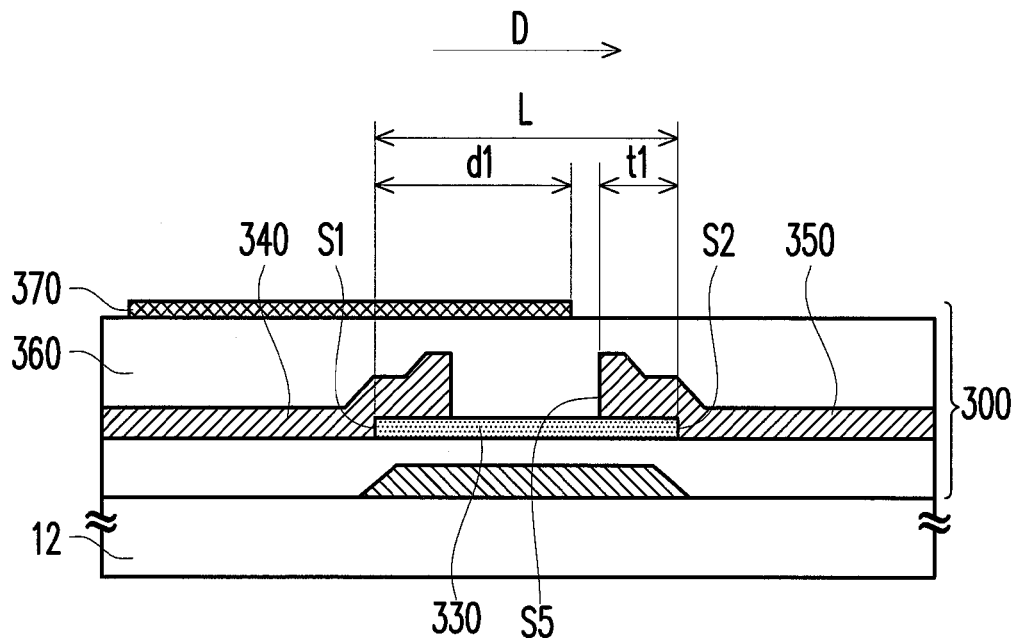
FIG. 3A is a cross-sectional view of a semiconductor structure according to another embodiment of the invention.
Figure 3B:
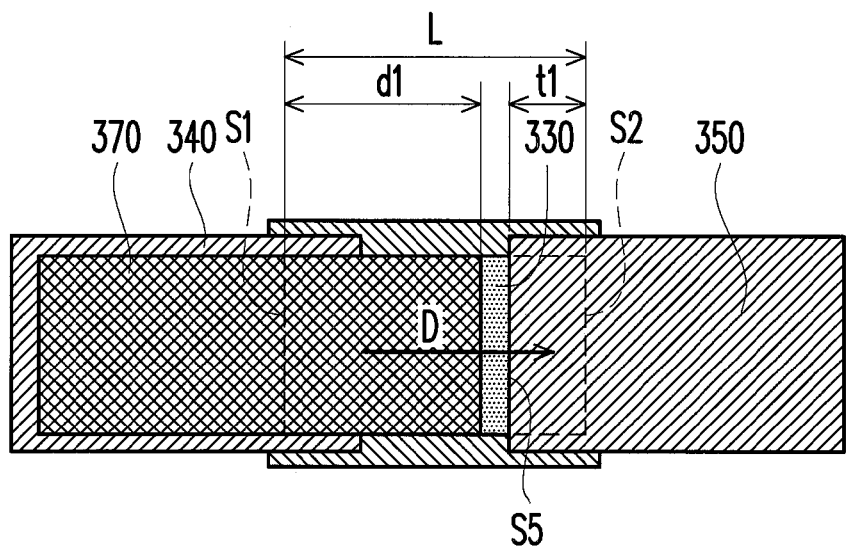
FIG. 3B is a top view of the semiconductor structure of FIG. 3A.

FIG. 3A is a cross-sectional view of a semiconductor structure according to another embodiment of the invention, and FIG. 3B is a top view of the semiconductor structure of FIG. 3A. For clarity's sake, only a part of the components of the semiconductor structure of FIG. 3A is illustrated in FIG. 3B. As shown in FIG. 3A and FIG. 3B, the semiconductor structure 300 is similar to the semiconductor structure 100 of the aforementioned embodiment except that a relative position of a source electrode 340, a drain electrode 350 and a channel layer 330 is different. In detail, the source electrode 340 and the drain electrode 350 of the present embodiment respectively cover a portion of the channel layer 330, i.e. the a first side S1 and a second side S2 of the channel layer 330 are respectively located under the source electrode 340 and the drain electrode 350. A dielectric layer 360 covers the source electrode 340, the drain electrode 350 and the channel layer 330. A conductive light-shielding pattern layer 370 is disposed on the dielectric layer 360. Similarly, the overlapping length d1 of the conductive light-shielding pattern layer 370 and the channel layer 330 along the channel direction D is $0.3 \leq d1/L \leq 0.85$, which is preferably $0.4 \leq d1/L \leq 0.7$.

Moreover, since the source electrode 340 and the drain electrode 350 respectively cover a portion of the channel layer 330, the overlapping position of the drain electrode 350 and the channel layer 330 can be further limited to avoid that the conductive light-shielding pattern layer 370 covers the drain electrode 350. In the present embodiment, the drain electrode 350 has a fifth side S5 along the channel direction D, and the fifth side S5 is overlapped to the channel layer 330. In this way, a distance between the fifth side S5 and the second side S2 along the channel direction D is defined as an overlapping length t1 of the drain electrode 350 and the channel layer 330. Compared to the overlapping length d1 of the conductive light-shielding pattern layer 170 and the channel layer 130 of $0.3 \leq d1/L \leq 0.85$ and preferably $0.4 \leq d1/L \leq 0.7$, the overlapping length t1 of the drain electrode 350 and the channel layer 330 is preferably $0 < t1/L < 0.15$. In this way, the conductive light-shielding pattern layer 370 is not over closed to the drain electrode 350 or even cover the drain electrode 350, so as to avoid generating the extra electric field during operation of the device, and prevent occurrence of the current leakage.

Figure 4A:
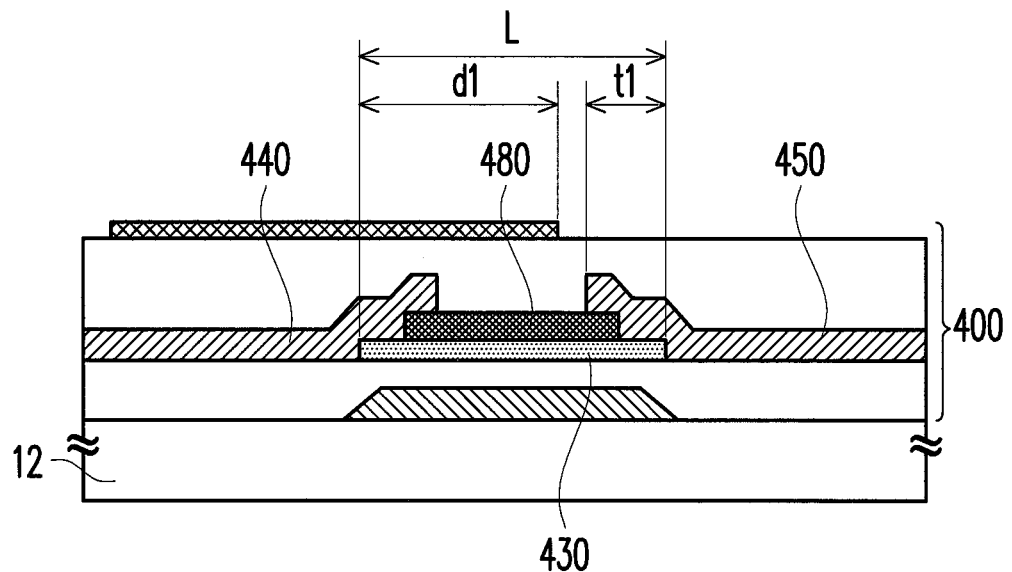
FIG. 4A is a cross-sectional view of a semiconductor structure according to another embodiment of the invention.
Figure 4B:
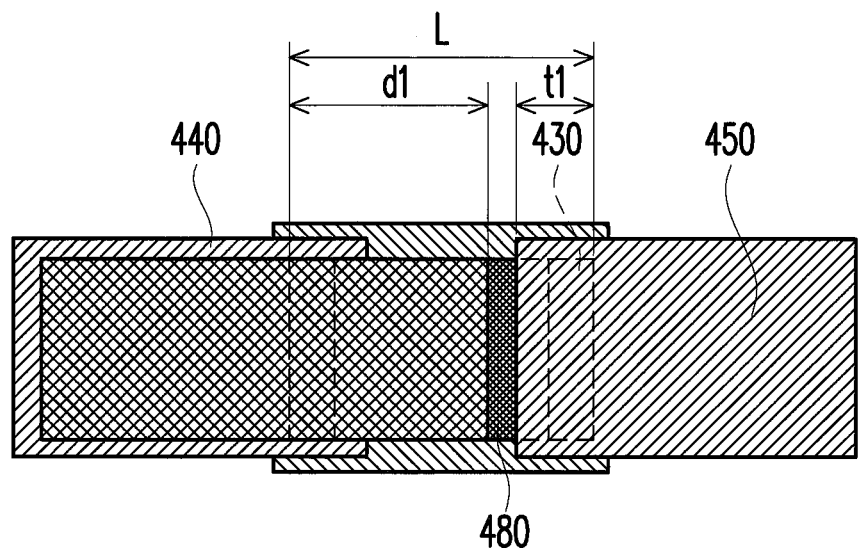
FIG. 4B is a top view of the semiconductor structure of FIG. 4A.

FIG. 4A is a cross-sectional view of a semiconductor structure according to another embodiment of the invention, and FIG. 4B is a top view of the semiconductor structure of FIG. 4A. For clarity's sake, only a part of the components of the semiconductor structure of FIG. 4A is illustrated in FIG. 4B. As shown in FIG. 4A and FIG. 4B, the semiconductor structure 400 is similar to the semiconductor structure 300 of the aforementioned embodiment except that the semiconductor structure 400 of the present embodiment further includes an etching stop layer 480 disposed on a channel layer 430, and a source electrode 440 and a drain electrode 450 respectively cover a portion of the etching stop layer 480. The other components and structural parameters such as the overlapping lengths d1 and t1, etc. of the present embodiment are the same to that of the semiconductor structure 300, and details thereof are not repeated.

Moreover, the semiconductor structures 300 and 400 show in FIGS. 3A and 3B and FIGS. 4A and 4B can also be applied to the organic electroluminescence device 20 of FIG. 2 to achieve similar technical effects.

Figure 5A:
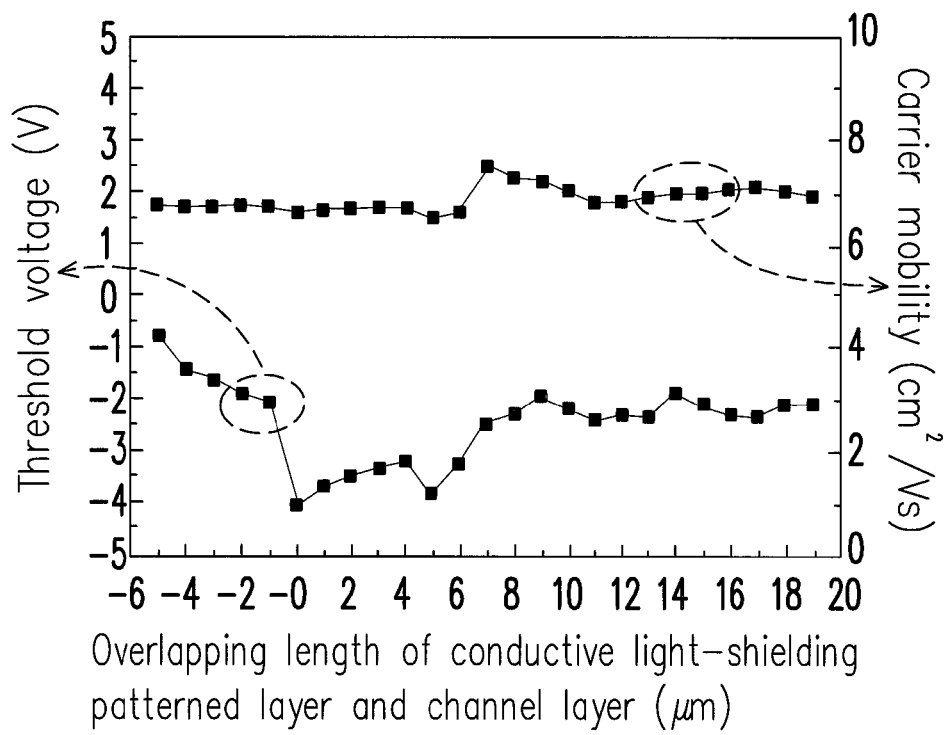
FIG. 5A is a diagram illustrating relationship curves of actually measured overlapping lengths d1 relative to threshold voltages and carrier mobility of a thin film transistor according to an embodiment of the invention.
Figure 5B:
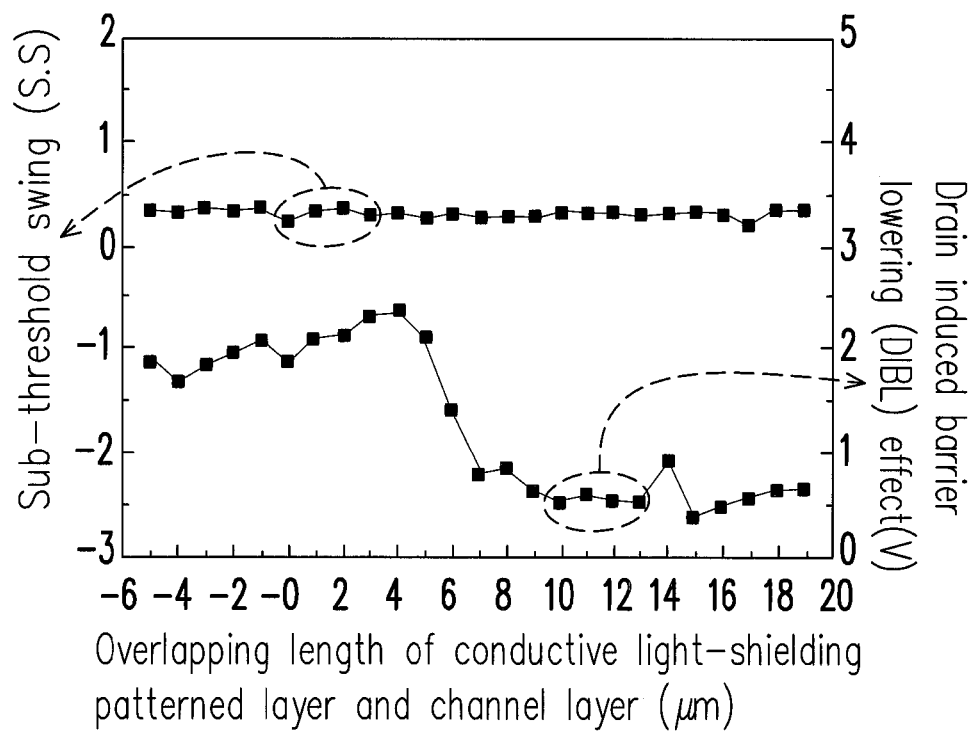
FIG. 5B is a diagram illustrating relationship curves of actually measured overlapping lengths d1 relative to sub-threshold swings and drain induced barrier lowering (DIBL) effects of a thin film transistor according to an embodiment of the invention.

FIG. 5A is a diagram illustrating relationship curves of actually measured overlapping lengths d1 relative to threshold voltages and carrier mobility of a thin film transistor according to an embodiment of the invention. FIG. 5B is a diagram illustrating relationship curves of actually measured overlapping lengths d1 relative to sub-threshold swings and DIBL effects of a thin film transistor according to an embodiment of the invention. In the embodiments of FIG. 5A and FIG. 5B, a length of the channel layer of the thin film transistor is about 23 µm, and the related curves of FIG. 5A and FIG. 5B represent variations of the aforementioned electrical characteristics of the thin film transistor due to variation of the overlapping length of the conductive light-shielding pattern layer and the channel layer from −6 µm to 20 µm. According to FIG. 5A and FIG. 5B, it is known that the carrier mobility and the sub-threshold swing of the thin film transistor are maintained stable under different overlapping lengths. Moreover, the DIBL effect of the thin film transistor is effectively mitigated when the overlapping length is greater than 4 µm, and meanwhile the threshold voltage of the thin film transistor also trends to be stable. The overlapping length d1 of the present embodiment is preferably not more than 20 µm to avoid overlapping of the conductive light-shielding pattern layer and the drain electrode. When the overlapping length d1 is within a range of 7-20 µm, the DIBL effect is effectively mitigated, which is even better within a range of 10-16 µm. A ratio between the overlapping length d1 within the range of 7-20 µm and the length (23 µm) of the channel layer is approximately complied with the aforementioned $0.3 \leq d1/L \leq 0.85$, and preferably $0.4 \leq d1/L \leq 0.7$.

In summary, in the invention, in order to mitigate the influence on the thin film transistor caused by light irradiation, a metal light-shielding pattern layer is fabricated on the semiconductor structure to shield the light from directly irradiating the channel layer. Meanwhile, considering when the light-shielding layer covers the drain electrode of the device, the current leakage phenomenon is probably occurred, the overlapping length of the metal light-shielding pattern layer and the channel layer is further adjusted to balance the light-shielding effect and the device performance. Therefore, not only variation of the device characteristics caused by light irradiation can be effectively prevented, but good and stable device characteristics can also be provided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A semiconductor structure, disposed on a substrate, and comprising:
    a gate electrode, disposed on the substrate;
    a gate insulating layer, disposed on the substrate, and covering the gate electrode;
    a channel layer, disposed on the gate insulating layer and located above the gate electrode, wherein the channel layer has a channel length L along a channel direction and has a first side and a second side opposite to the first side;

a source electrode and a drain electrode, located at the two opposite sides of the channel layer, and electrically connected to the first side and the second side of the channel layer, respectively;

a dielectric layer, covering the source electrode, the drain electrode and the channel layer; and a conductive light-shielding pattern layer, disposed on the dielectric layer, and overlapped to a portion of the source electrode and a portion of the channel layer in a vertical projection, wherein the conductive light-shielding pattern layer does not overlap to the drain in the vertical projection, and the conductive light-shielding pattern layer and the channel layer have an overlapping length d1, and $0.3 \leq d1/L \leq 0.85$.

2. The semiconductor structure as claimed in claim 1, wherein a material of the channel layer comprises oxide semiconductor.

3. The semiconductor structure as claimed in claim 2, wherein the oxide semiconductor comprises indium gallium zinc oxide (IGZO).

4. The semiconductor structure as claimed in claim 1, wherein the conductive light-shielding pattern layer has a third side and a fourth side along the channel direction, the fourth side is overlapped to the channel layer in the vertical projection, wherein the overlapping length d1 is equal to a distance between the fourth side and the first side of the channel layer along the channel direction.

5. The semiconductor structure as claimed in claim 1, wherein the channel layer covers a portion of the source electrode and a portion of the drain electrode.

6. The semiconductor structure as claimed in claim 1, wherein the source electrode and the drain electrode respectively cover a portion of the channel layer.

7. The semiconductor structure as claimed in claim 6, further comprising an etching stop layer disposed on the channel layer, wherein the source electrode and the drain electrode respectively cover a portion of the etching stop layer.

8. The semiconductor structure as claimed in claim 6, wherein the drain electrode has a fifth side along the channel direction, wherein the fifth side is overlapped to the channel layer, and the fifth side and the second side are spaced by a distance t1 along the channel direction, and $0 < t1/L < 0.15$.

9. An organic electroluminescence device, disposed on a substrate, and comprising:

a gate electrode, disposed on the substrate;

a gate insulating layer, disposed on the substrate, and covering the gate electrode;

a channel layer, disposed on the gate insulating layer and located above the gate electrode, wherein the channel layer has a channel length L along a channel direction and has a first side and a second side opposite to the first side;

a source electrode and a drain electrode, located at the two opposite sides of the channel layer, and electrically connected to the first side and the second side of the channel layer, respectively;

a dielectric layer, covering the source electrode, the drain electrode and the channel layer;

a conductive light-shielding pattern layer, disposed on the dielectric layer, and overlapped to a portion of the source electrode and a portion of the channel layer in a vertical projection, wherein the conductive light-shielding pattern layer does not overlap to the drain in the vertical projection, and the conductive light-shielding pattern layer and the channel layer have an overlapping length d1, and $0.3 \leq d1/L \leq 0.85$;

a lower electrode, disposed on the dielectric layer and electrically connected to the drain electrode;

an organic light emitting layer, disposed on the lower electrode; and an upper electrode, disposed on the organic light emitting layer.

10. The organic electroluminescence device as claimed in claim 9, wherein a material of the channel layer comprises oxide semiconductor.

11. The organic electroluminescence device as claimed in claim 10, wherein the oxide semiconductor comprises indium gallium zinc oxide (IGZO).

12. The organic electroluminescence device as claimed in claim 9, wherein the conductive light-shielding pattern layer has a third side and a fourth side along the channel direction, the fourth side is overlapped to the channel layer in the vertical projection, wherein the overlapping length d1 is equal to a distance between the fourth side and the first side of the channel layer along the channel direction.

13. The organic electroluminescence device as claimed in claim 9, wherein the channel layer covers a portion of the source electrode and a portion of the drain electrode.

14. The organic electroluminescence device as claimed in claim 9, wherein the source electrode and the drain electrode respectively cover a portion of the channel layer.

15. The organic electroluminescence device as claimed in claim 14, further comprising an etching stop layer disposed on the channel layer, wherein the source electrode and the drain electrode respectively cover a portion of the etching stop layer.

16. The organic electroluminescence device as claimed in claim 14, wherein the drain electrode has a fifth side along the channel direction, wherein the fifth side is overlapped to the channel layer, and the fifth side and the second side are spaced by a distance t1 along the channel direction, and $0 < t1/L < 0.15$.

17. The semiconductor structure as claimed in claim 1, wherein the conductive light-shielding pattern layer and the drain electrode are spaced by a distance along the channel direction in the vertical projection.

18. The organic electroluminescence device as claimed in claim 9, wherein the conductive light-shielding pattern layer and the drain electrode are spaced by a distance along the channel direction in the vertical projection.

* * * * *